United States Patent
Xie et al.

(10) Patent No.: US 12,463,132 B2
(45) Date of Patent: Nov. 4, 2025

(54) SEMICONDUCTOR STRUCTURE WITH BACKSIDE METALLIZATION LAYERS

(71) Applicant: International Business Machines Corporation, Armonk, NY (US)

(72) Inventors: Ruilong Xie, Niskayuna, NY (US); Koichi Motoyama, Clifton Park, NY (US); Nicholas Anthony Lanzillo, Wynantskill, NY (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 511 days.

(21) Appl. No.: 18/078,454

(22) Filed: Dec. 9, 2022

(65) Prior Publication Data
US 2024/0194586 A1   Jun. 13, 2024

(51) Int. Cl.
*H01L 23/522*   (2006.01)
*H01L 21/768*   (2006.01)
*H01L 23/528*   (2006.01)

(52) U.S. Cl.
CPC .... *H01L 23/5226* (2013.01); *H01L 21/76802* (2013.01); *H01L 21/76831* (2013.01); *H01L 21/76877* (2013.01); *H01L 23/5286* (2013.01)

(58) Field of Classification Search
CPC ........... H01L 23/5226; H01L 21/76802; H01L 21/76831; H01L 21/76877; H01L 23/5286; H01L 23/5283; H01L 23/485
See application file for complete search history.

(56) References Cited

U.S. PATENT DOCUMENTS

| | | | |
|---|---|---|---|
| 8,866,260 B2 | 10/2014 | Shieh et al. | |
| 11,251,156 B2 | 2/2022 | Mueller et al. | |
| 11,355,601 B2 | 6/2022 | Chiang et al. | |
| 11,404,534 B2 | 8/2022 | Kao et al. | |
| 11,417,628 B2 | 8/2022 | Chen et al. | |
| 12,356,688 B2 * | 7/2025 | Wang | H10D 84/0151 |
| 2012/0292777 A1 | 11/2012 | Lotz | |

(Continued)

FOREIGN PATENT DOCUMENTS

| | | |
|---|---|---|
| JP | 2007158169 A | 6/2007 |
| WO | 2022056732 A1 | 3/2022 |

(Continued)

OTHER PUBLICATIONS

N. Watanabe et al., "Development of Backside Buried Metal Layer Technology for 3D-ICs," International Symposium on Microelectronics, Oct. 2019, pp. 000268-000273, vol. 2019, No. 1.

(Continued)

*Primary Examiner* — Karen Kusumakar
(74) *Attorney, Agent, or Firm* — Samuel Waldbaum; Ryan, Mason & Lewis, LLP

(57) ABSTRACT

A semiconductor structure includes a first metallization layer having a first plurality of metal containing lines, and a second metallization layer located above the first metallization layer. The second metallization layer includes a second plurality of metal containing lines. A first group of the second plurality of metal containing lines is disposed within the first metallization layer. The first group of the second plurality of metal containing lines is isolated from the first metallization layer by a dielectric barrier layer.

20 Claims, 14 Drawing Sheets

(56) References Cited

U.S. PATENT DOCUMENTS

| | | |
|---|---|---|
| 2013/0270704 A1 | 10/2013 | Chang et al. |
| 2013/0292836 A1 | 11/2013 | Tang et al. |
| 2021/0098691 A1* | 4/2021 | Yang .................. H10N 50/80 |
| 2021/0305381 A1 | 9/2021 | Chiang et al. |
| 2021/0343578 A1 | 11/2021 | Chang et al. |
| 2021/0351303 A1 | 11/2021 | Ju et al. |
| 2021/0358842 A1 | 11/2021 | Huang et al. |
| 2021/0376071 A1 | 12/2021 | Liu et al. |
| 2022/0020665 A1 | 1/2022 | Li et al. |
| 2022/0181300 A1 | 6/2022 | Liebmann et al. |
| 2022/0328399 A1* | 10/2022 | Preston ................ H01L 23/481 |
| 2024/0170395 A1* | 5/2024 | Lanzillo ............ H01L 23/53295 |

FOREIGN PATENT DOCUMENTS

| | | |
|---|---|---|
| WO | PCT/CN2023/134206 | 2/2024 |
| WO | 2024/120231 A1 | 6/2024 |

OTHER PUBLICATIONS

Z. Xu et al., "Decoupling Capacitor Modeling and Characterization for Power Supply Noise in 3D Systems," 2012 SEMI Advanced Semiconductor Manufacturing Conference, May 2012, pp. 414-419.

M. O. Hossen et al., "Power Delivery Network (PDN) Modeling for Backside-PDN Configurations with Buried Power Rails and μTSVs," IEEE Transactions on Electron Devices, Dec. 13, 2019, pp. 11-17, vol. 67, No. 1.

* cited by examiner

SEMICONDUCTOR STRUCTURE WITH BACKSIDE METALLIZATION LAYERS

BACKGROUND

Generally, semiconductor devices can include a plurality of circuits which form an integrated circuit fabricated on a substrate. A complex network of signal paths can be routed to connect the circuit elements distributed on the surface of the substrate. Efficient routing of these signals can include the formation of multilevel or multilayered schemes (e.g., single or dual damascene wiring structures) during the back-end-of-line (BEOL) phase of manufacturing. Within an interconnect structure, conductive vias can run perpendicular to the substrate and conductive lines can run parallel to the substrate.

SUMMARY

Illustrative embodiments of the present application include techniques for use in semiconductor manufacture. In an illustrative embodiment, a semiconductor structure comprises a first metallization layer comprising a first plurality of metal containing lines, and a second metallization layer located above the first metallization layer. The second metallization layer comprises a second plurality of metal containing lines. A first group of the second plurality of metal containing lines is disposed within the first metallization layer. The first group of the second plurality of metal containing lines is isolated from the first metallization layer by a dielectric barrier layer.

The semiconductor structure of the illustrative embodiment advantageously allows for forming power (Vdd) rails and ground (GND or Vss) rails in backside metallization levels for a backside power delivery network without any via connections. This, in turn, can increase the decoupling capacitance while reducing power supply noise, thereby improving chip performance. In addition, by forming the backside metallization levels without any via patterning, less steps are required allowing for a more efficient fabrication of the resulting semiconductor structure.

In one or more additional illustrative embodiments, as may be combined with the preceding paragraphs, the first metallization layer is a first backside metallization layer and the second metallization layer is a second backside metallization layer.

In one or more additional illustrative embodiments, as may be combined with the preceding paragraphs, the second plurality of metal containing lines are oriented perpendicular to the first plurality of metal containing lines.

In one or more additional illustrative embodiments, as may be combined with the preceding paragraphs, the second plurality of metal containing lines further comprises a second group of the second plurality of metal containing lines, wherein at least one of the metal containing lines of the second group is disposed on at least one of the first plurality of metal containing lines.

In one or more additional illustrative embodiments, as may be combined with the preceding paragraphs, the first group of the second plurality of metal containing lines comprises ground Vss rails.

In one or more additional illustrative embodiments, as may be combined with the preceding paragraphs, the second group of the second plurality of metal containing lines comprises power Vdd rails.

In one or more additional illustrative embodiments, as may be combined with the preceding paragraphs, the dielectric barrier layer comprises a high-k dielectric material.

In one or more additional illustrative embodiments, as may be combined with the preceding paragraphs, the first metallization layer and the second metallization layer are part of a backside power delivery network.

In one or more additional illustrative embodiments, as may be combined with the preceding paragraphs, the second plurality of metal containing lines further comprises a second group of the second plurality of metal containing lines in direct contact with a first group of the first plurality of metal containing lines.

According to another exemplary embodiment, a semiconductor structure comprises a first metallization layer comprising a first plurality of metal containing lines in a first orientation, and a second metallization layer located above the first metallization layer. The second metallization layer comprises a second plurality of metal containing lines in a second orientation. The second plurality of metal containing lines comprises a first group of the second plurality of metal containing lines and a second group of the second plurality of metal containing lines. The first group of the second plurality of metal containing lines is disposed within the first metallization layer and isolated from the first metallization layer by a dielectric barrier layer. At least one of the metal containing lines of the second group of the second plurality of metal containing lines is directly connected to at least one of the first plurality of metal containing lines.

The semiconductor structure of the illustrative embodiment advantageously allows for forming power (Vdd) rails and ground (GND or Vss) rails in backside metallization levels for a backside power delivery network without any via connections. This, in turn, can increase the decoupling capacitance while reducing power supply noise, thereby improving chip performance. In addition, by forming the backside metallization levels without any via patterning, less steps are required allowing for a more efficient fabrication of the resulting semiconductor structure.

In one or more additional illustrative embodiments, as may be combined with the preceding paragraphs, the first metallization layer is a first backside metallization layer and the second metallization layer is a second backside metallization layer.

In one or more additional illustrative embodiments, as may be combined with the preceding paragraphs, the second plurality of metal containing lines are oriented perpendicular to the first plurality of metal containing lines.

In one or more additional illustrative embodiments, as may be combined with the preceding paragraphs, the first group of the second plurality of metal containing lines comprises ground Vss rails.

In one or more additional illustrative embodiments, as may be combined with the preceding paragraphs, the second group of the second plurality of metal containing lines comprises power Vdd rails.

In one or more additional illustrative embodiments, as may be combined with the preceding paragraphs, the dielectric barrier layer comprises a high-k dielectric material.

In one or more additional illustrative embodiments, as may be combined with the preceding paragraphs, the first metallization layer and the second metallization layer are part of a backside power delivery network.

In one or more additional illustrative embodiments, as may be combined with the preceding paragraphs, the first plurality of metal containing lines comprises a first group comprising ground Vss rails and a second group comprising power Vdd rails.

Another exemplary embodiment comprises an integrated circuit comprising one or more semiconductor structures. At least one of the one or more semiconductor structures is a semiconductor structure according to one or more of the foregoing illustrative embodiments.

The integrated circuit of the illustrative embodiment advantageously allows for forming power (Vdd) rails and ground (GND or Vss) rails in backside metallization levels for a backside power delivery network without any via connections. This, in turn, can increase the decoupling capacitance while reducing power supply noise, thereby improving chip performance. In addition, by forming the backside metallization levels without any via patterning, less steps are required allowing for a more efficient fabrication of the resulting semiconductor structure.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figure 1A:
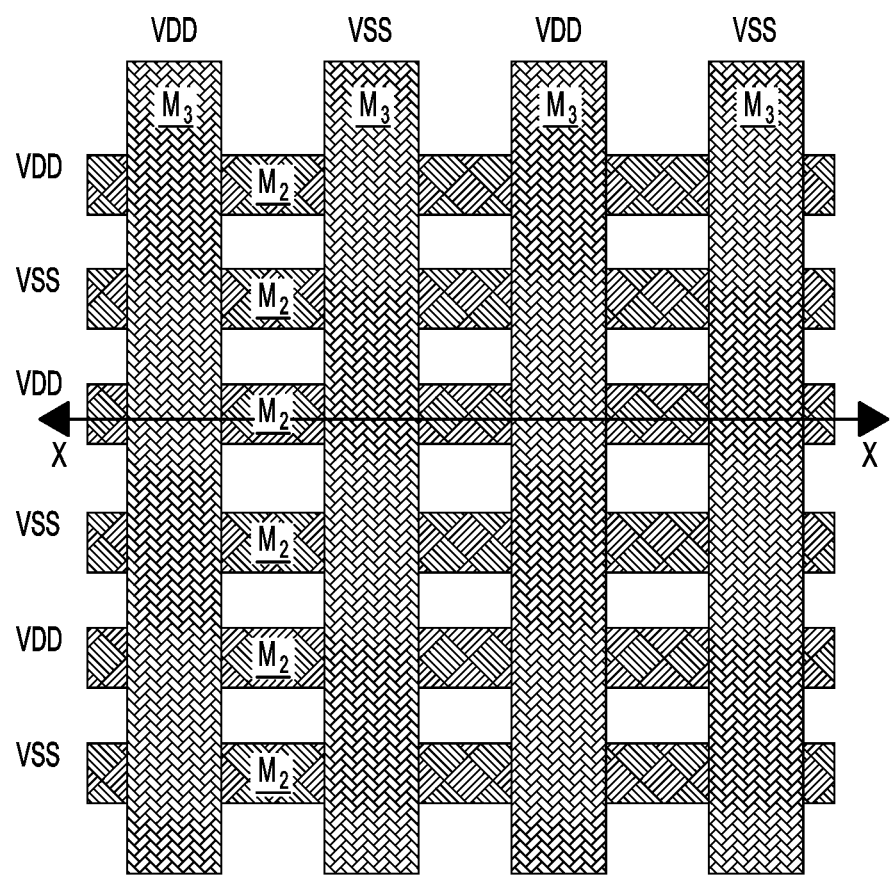
FIG. 1A depicts a top-down view illustrating a semiconductor structure according to an illustrative embodiment.

This disclosure relates generally to semiconductor devices, and more particularly to metallization levels for increasing decoupling capacitance between power (Vdd) rails and ground (GND or Vss) rails for a backside power delivery network (BSPDN) and methods for their fabrication. However, it is to be understood that embodiments of the invention are not limited to the illustrative methods, apparatus, systems and devices but instead are more broadly applicable to other suitable methods, apparatus, systems and devices.

A semiconductor device can include multiple metallization levels ("levels"), each including a conductive line ("line") formed in an interlayer dielectric layer (ILD). Although the term metallization is used herein, metallization levels can be formed to include any suitable conductive material in accordance with the embodiments described herein. Upper lines can be connected to lower lines by vias. Levels can be identified herein using the designation X, where X is a positive integer from 1 to N. The levels are identified from the level closest to the substrate to the level furthest from the substrate as 1 through N where 1 is the first or lowermost level and N is the last or uppermost level. A line in the X level is designated as an $M_X$ line, and a via in the X level is designated as a $V_{(X-1)}$ via. Note that there are no $V_0$ vias or via bars. When a line in an upper level is designated $M_X$, then a line in an immediately lower level can be designated $M_{(X-1)}$. Likewise, when a line in a lower level is designated $M_X$, then a line in an immediately higher level is designated $M_{(X+1)}$. For a first level (X=1), the line is $M_1$ and there are no "$V_0$" vias as the connection from $M_1$ to devices below $M_1$ is generally made through separately formed contacts in a contact layer ("CA"). For a second level (X=2), the line is $M_2$ and the vias are $V_1$ and, for a third level (X=3), the line is $M_3$ and the vias or via bars are $V_3$.

It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. Also, in the figures, the illustrated scale of one layer, structure, and/or region relative to another layer, structure, and/or region is not necessarily intended to represent actual scale.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In conventional semiconductor technology, there are front-end-of-line (FEOL), back-end-of-line (BEOL), and the section that connects those two together, the middle-of-line (MOL) interconnect. The interconnects in the BEOL comprise both signal wirings and power delivery networks. For the signal wirings, there is a need to minimize parasitic capacitance, so it is desired to separate metal lines from different levels, and connect them where it is needed by a via to minimize the capacitance.

Recently, the industry is moving to backside power distribution network, so present technologies will include four components: FEOL, MOL, BEOL and backside interconnects. When backside interconnects are used for power delivery, minimizing parasitic capacitance is no longer needed (as that is a requirement for signal wirings). Therefore, the illustrative embodiments disclosed herein teach a method and structure to remove vias between metal lines at different levels to bring the metal lines in closer proximity to each other and to increase the parasitic capacitance.

Referring now to the drawings in which like numerals represent the same of similar elements, FIGS. 1A-13 illustrate various processes for fabricating skip via connections between backside metallization levels. Note that the same reference numeral (100) is used to denote the semiconductor structure through the various intermediate fabrication stages illustrated in FIGS. 1A-13. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1A-13 are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Figure 12:
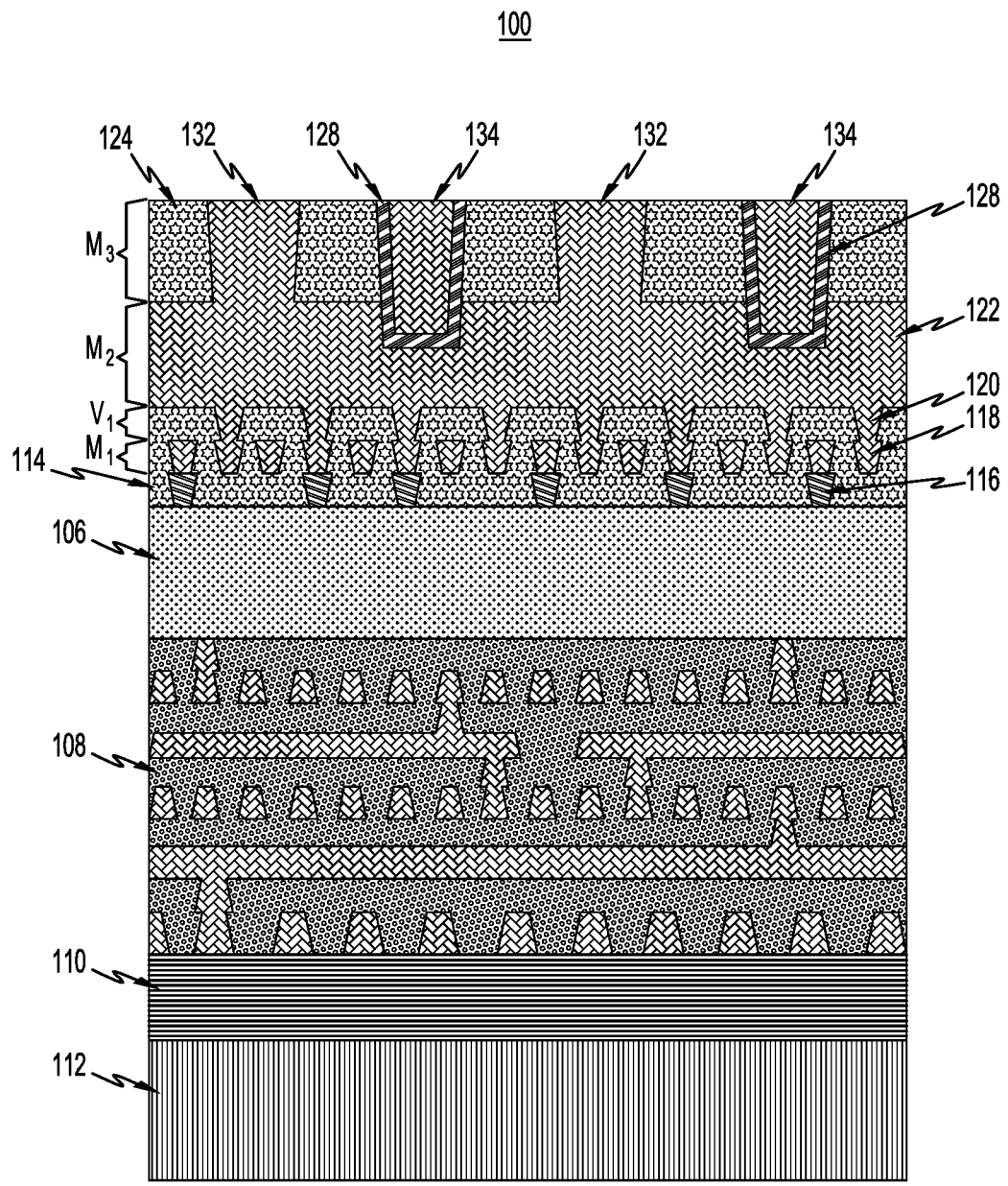
FIG. 12 depicts a cross-sectional view of a semiconductor structure taken along the X-X axis of FIG. 1A at a twelfth-intermediate fabrication stage, according to an illustrative embodiment.
Figure 13:
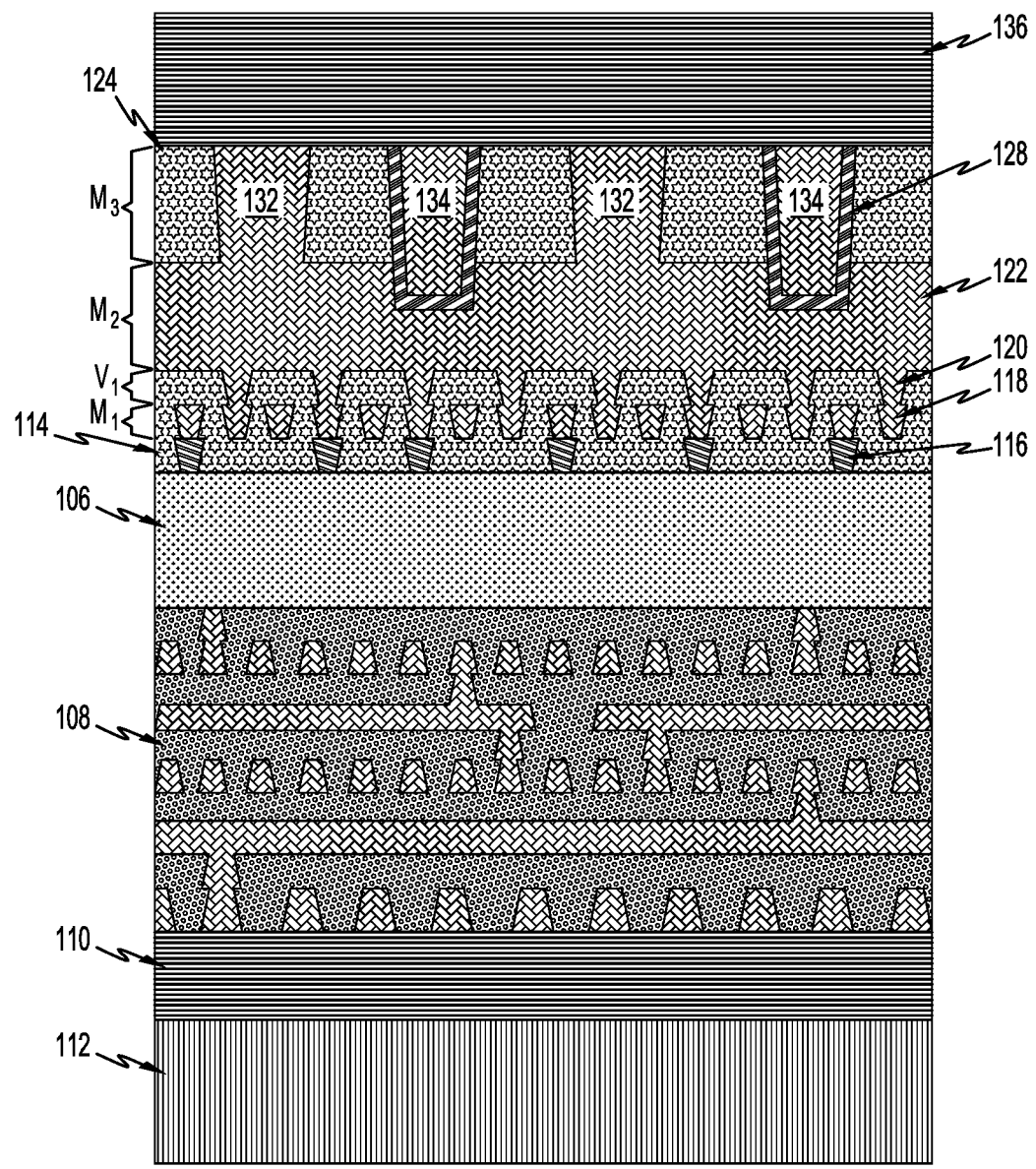
FIG. 13 depicts a cross-sectional view of a semiconductor structure taken along the X-X axis of FIG. 1A at a thirteenth-intermediate fabrication stage, according to an illustrative embodiment.

FIG. 1A illustrates a top-down view showing where power (Vdd) rails and ground (GND or Vss) rails in a second backside metallization layer $M_2$ and a third backside metallization layer $M_3$ for a backside power delivery network (BSPDN) will be formed (See, e.g., FIGS. 12 and 13). FIG. 1A further shows that the second metallization layer $M_2$ comprises a first plurality of metal containing lines in a first orientation, and third metallization layer $M_3$, located above the second metallization layer $M_2$, comprises a second plurality of metal containing lines in a second orientation. In an illustrative embodiment, the second plurality of metal containing lines are oriented perpendicular to the first plurality of metal containing lines.

Figure 1B:
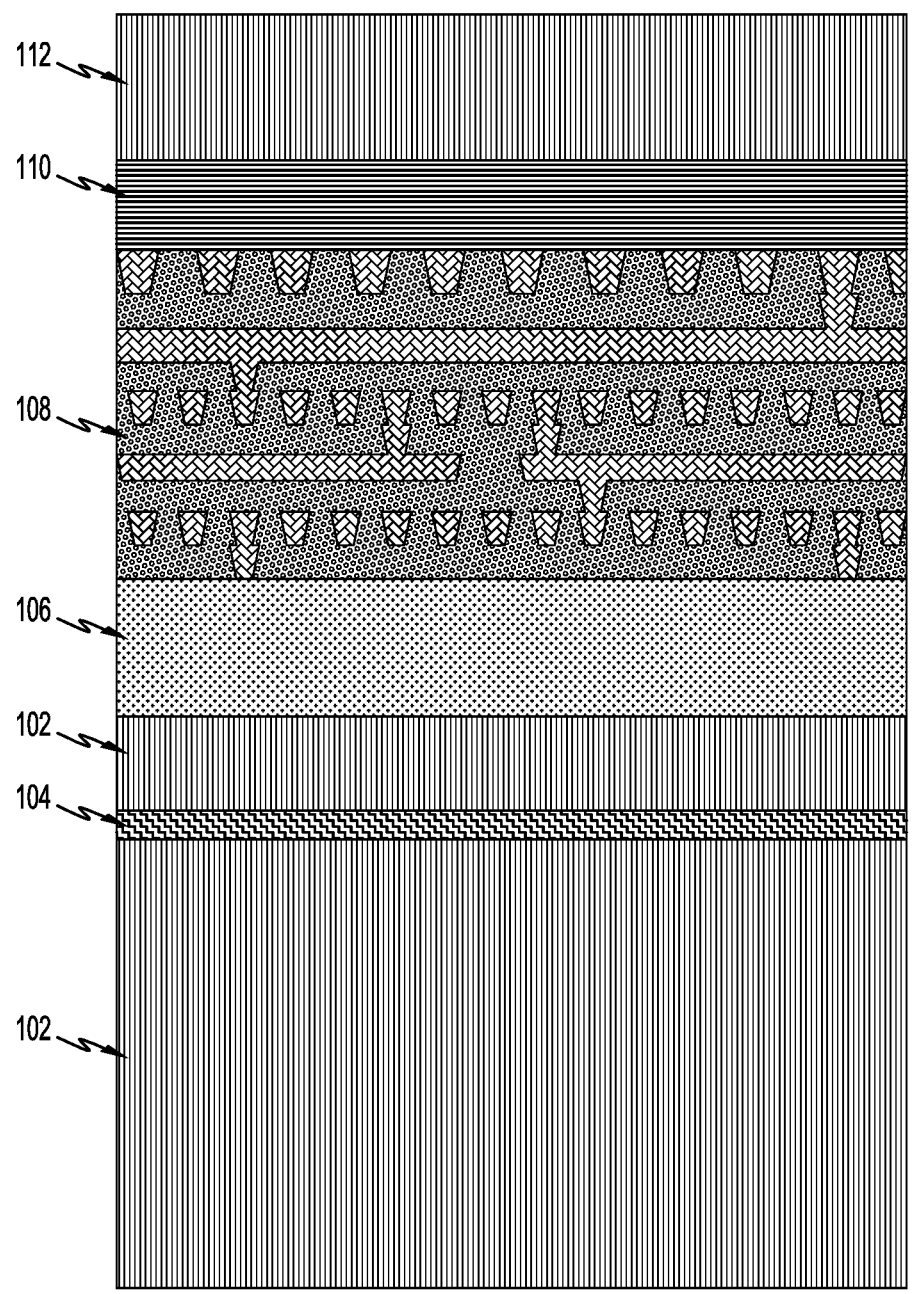
FIG. 1B depicts a cross-sectional view of a semiconductor structure taken along the X-X axis of FIG. 1A at a first-intermediate fabrication stage, according to an illustrative embodiment.

FIG. 1B illustrates a cross-sectional view of a semiconductor structure 100 taken along the X-X axis of FIG. 1A at a first-intermediate fabrication stage. Semiconductor structure 100 includes a substrate layer 102. The substrate layer 102 may be formed of any suitable semiconductor material, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate layer 102 is silicon.

An etch stop layer 104 is formed in the substrate layer 102. The etch stop layer 104 may comprise a buried oxide (BOX) layer or silicon germanium (SiGe), or another suitable material such as a III-V semiconductor epitaxial layer. The etch stop layer 104 may have a height in the range of 10 to 30 nanometers (nm).

Device layer 106 includes various device components for the semiconductor structure 100, such as, for example, active transistors, like complementary metal oxide semiconductor (CMOS) circuits, bipolar junction transistor (BJT) transistors, passive device like resistors, capacitors, diodes, etc. Device layer 106 can also include a wiring scheme that is disposed on both sides of the device layer (e.g., middle-of-the-line interconnects to wire the devices to BEOL, and source/drain sacrificial placeholders to enable backside contact formation later to wire the devices to backside interconnect).

Lower frontside BEOL layer 108 contains various BEOL interconnect structures including, for example, insulating layers (dielectrics), metal levels, and/or via levels. In illustrative embodiments, lower frontside BEOL layer 108 may only be used for signal routing, without any power distribution network.

Upper frontside BEOL layer 110 contains various BEOL interconnect structures including, for example, insulating layers (dielectrics), metal levels, via levels and bonding sites. In illustrative embodiments, upper frontside BEOL layer 110 may comprise only signal wiring. In illustrative embodiments, upper frontside BEOL layer 110 may comprise both signal wiring and wires for power delivery.

Carrier wafer 112 is bonded to upper frontside BEOL layer 110. The carrier wafer 112 may be formed of materials similar to that of the substrate layer 102, and may be formed over the upper frontside BEOL layer 110 using a wafer bonding process, such as dielectric-to-dielectric bonding.

Figure 2:
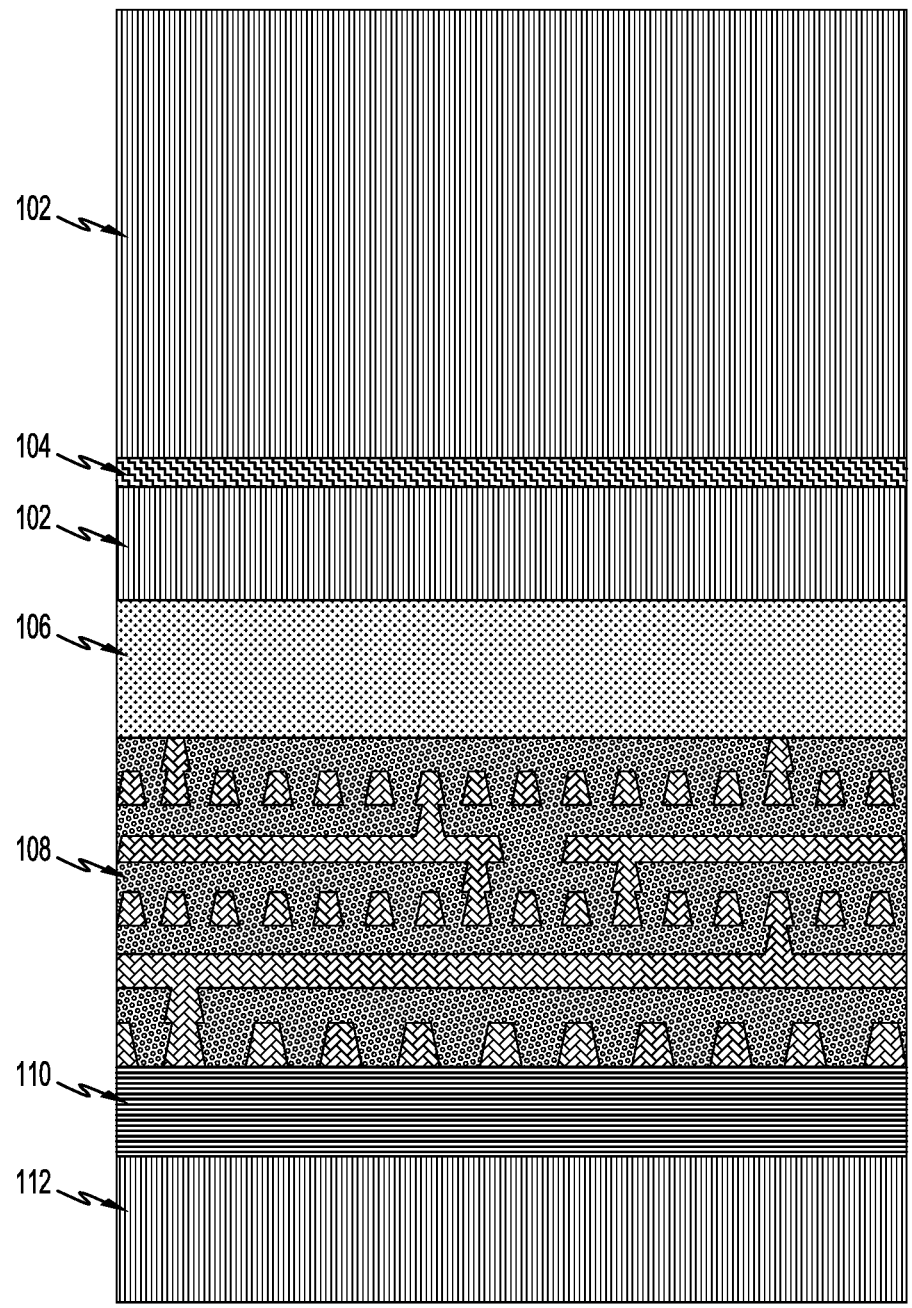
FIG. 2 depicts a cross-sectional view of a semiconductor structure taken along the X-X axis of FIG. 1A at a second-intermediate fabrication stage, according to an illustrative embodiment.

FIG. 2 illustrates semiconductor structure 100 at a second-intermediate fabrication stage. During this stage, using the carrier wafer 112, the semiconductor structure 100 is "flipped" over so that the backside of the substrate layer 102 (i.e., the back surface) is facing up for backside processing as shown.

Figure 3:
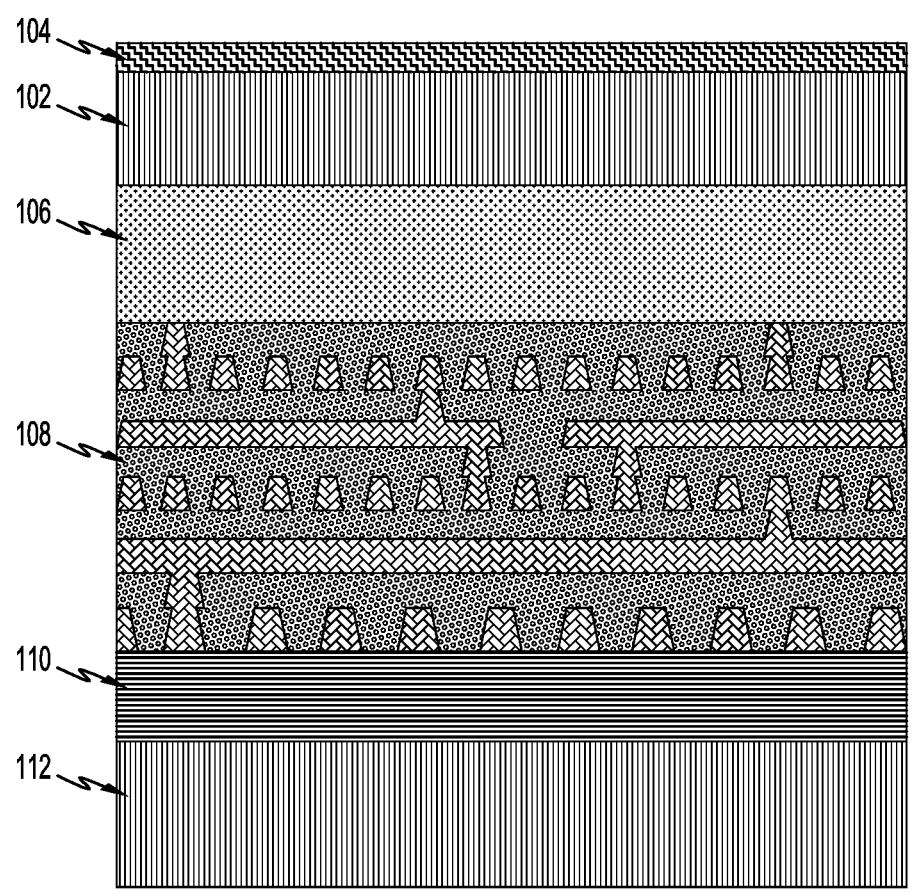
FIG. 3 depicts a cross-sectional view of a semiconductor structure taken along the X-X axis of FIG. 1A at a third-intermediate fabrication stage, according to an illustrative embodiment.

FIG. 3 illustrates semiconductor structure 100 at a third-intermediate fabrication stage. During this stage, portions of the substrate layer 102 may be removed from the backside using, for example, a combination of wafer grinding, chemical mechanical planarization (CMP), dry etch and wet etch processes to selectively remove substrate layer 102 until the etch stop layer 104 is reached.

Figure 4:
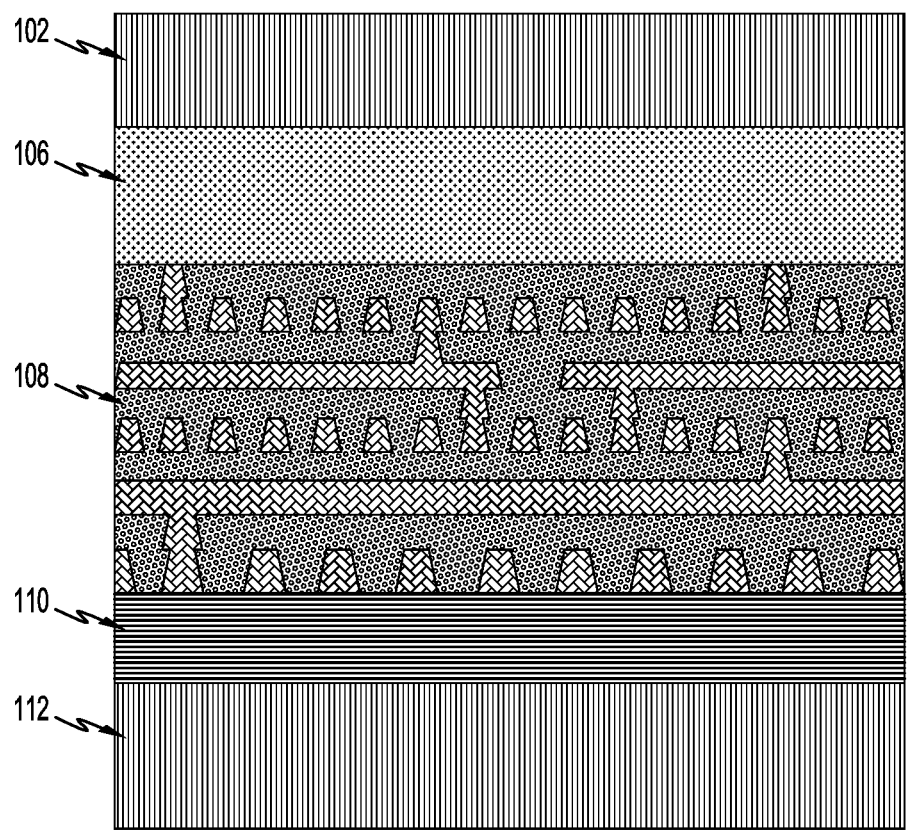
FIG. 4 depicts a cross-sectional view of a semiconductor structure taken along the X-X axis of FIG. 1A at a fourth-intermediate fabrication stage, according to an illustrative embodiment.

FIG. 4 illustrates semiconductor structure 100 at a fourth-intermediate fabrication stage. During this stage, the etch stop layer 104 is selectively removed using, for example, a wet etch to selectively remove etch stop layer 104 until substrate layer 102 is reached.

Figure 5:
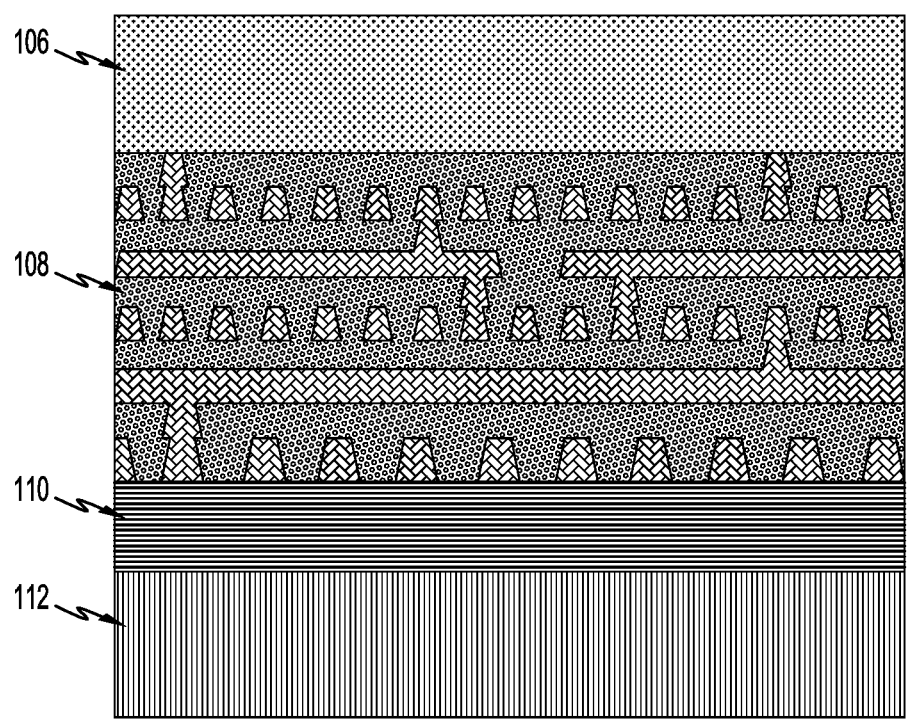
FIG. 5 depicts a cross-sectional view of a semiconductor structure taken along the X-X axis of FIG. 1A at a fifth-intermediate fabrication stage, according to an illustrative embodiment.

FIG. 5 illustrates semiconductor structure 100 at a fifth-intermediate fabrication stage. During this stage, the remaining portions of the substrate layer 102 are removed to expose the device layer 106. The remaining portions of the substrate layer 102 can be removed utilizing a selective etch process such as a wet etch.

Figure 6:
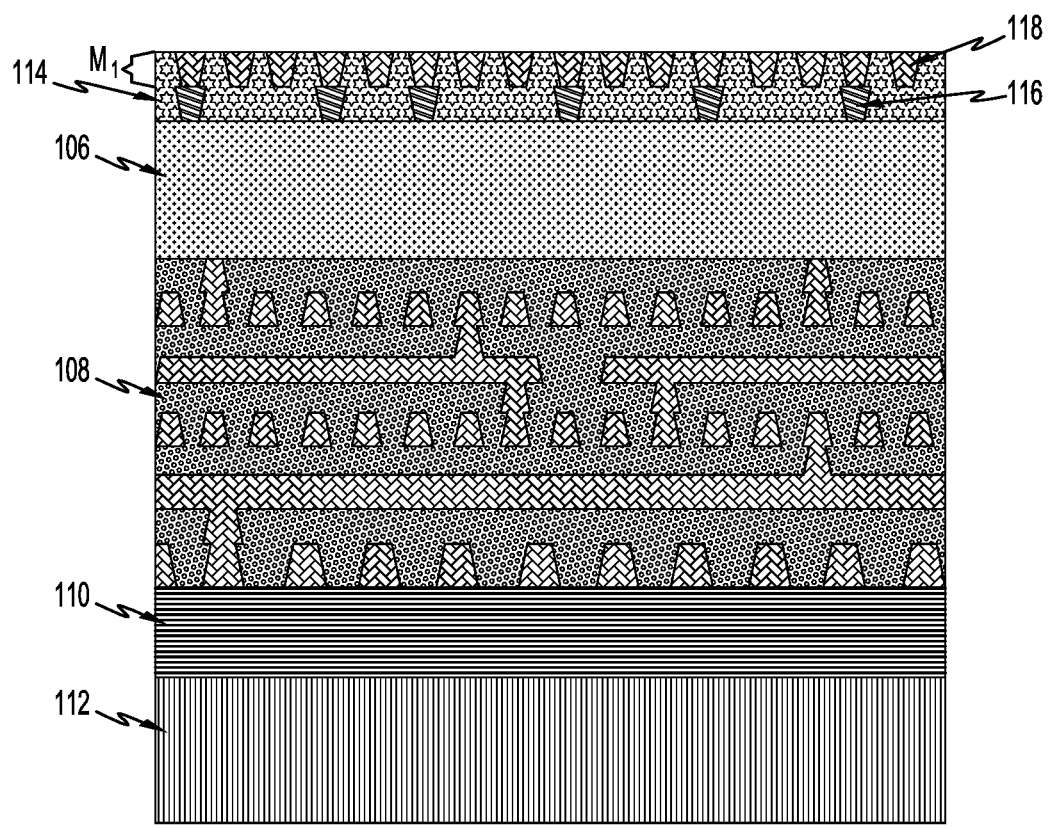
FIG. 6 depicts a cross-sectional view of a semiconductor structure taken along the X-X axis of FIG. 1A at a sixth-intermediate fabrication stage, according to an illustrative embodiment.

FIG. 6 illustrates semiconductor structure 100 at a sixth-intermediate fabrication stage. During this stage, a backside interlayer dielectric (ILD) layer 114 is formed on device layer 106 containing backside middle-of-the-line contacts 116 and first backside metallization layer $M_1$ having metal containing lines 118. Backside ILD layer 114 may be formed of any suitable isolating material, such as $SiO_2$, SiOC, SiON, etc. In illustrative embodiments, backside ILD layer 114 is first formed on device layer 106 using any conventional deposition technique such as physical vapor deposition (PVD), atomic layer deposition (ALD), chemical vapor deposition (CVD) and/or plating, followed by a planarization process such as CMP or any other suitable planarization process.

Backside middle-of-the-line contacts 116 are formed in backside ILD layer 114 by any conventional technique. For example, backside middle-of-the-line contacts 116 can be formed by patterning backside ILD layer 114 and utilizing conventional lithographic and etching processes to form vias. Next, contact metals are formed, which comprise a silicide liner, such as Ti, Ni, NiPt, etc., an adhesion metal liner, such as TiN and a high conductance metal, for example, tungsten (W), aluminum (Al), copper (Cu), cobalt (Co), ruthenium (Ru), molybdenum (Mo), or any other suitable conductive material. In various embodiments, the high conductance metal can be deposited by PVD, ALD, CVD and/or plating. The high conductance metal can be planarized using, for example, a planarizing process such as CMP. Other planarization processes can include grinding and polishing.

First backside metallization layer $M_1$ is formed in backside ILD layer 114 by any conventional technique. For example, first backside metallization layer $M_1$ can be formed by depositing an additional backside ILD layer 114 on the top surface of semiconductor structure 100, patterning the additional backside ILD layer 114 and utilizing conventional lithographic and etching processes to form vias. The etch process may be an anisotropic etch, such as reactive ion etch (RIE). The etch process may also be a selective etch process. Next, metal containing lines 118 are formed from any suitable conductive metal including, for example, copper (Cu), aluminum (Al), chromium (Cr), cobalt (Co), hafnium (Hf), iridium (Ir), molybdenum (Mo), niobium (Nb), osmium (Os), rhenium (Re), rhodium (Rh), ruthenium (Ru), tantalum (Ta), titanium (Ti), tungsten (W), vanadium (V), zirconium (Zr), and alloys thereof. In one embodiment, a conductive metal layer is one or more of Al, Ru, Ta, Ti or W. In one embodiment, a conductive metal is Ru.

Figure 7:
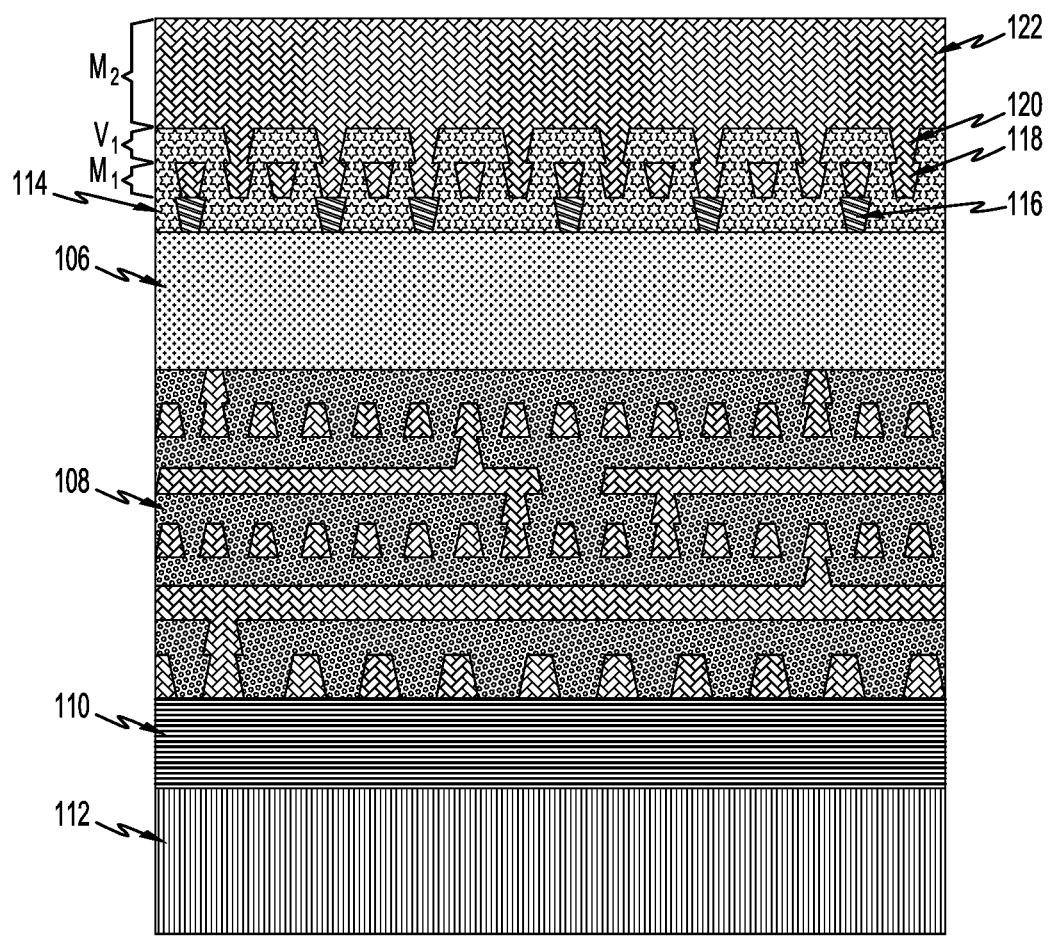
FIG. 7 depicts a cross-sectional view of a semiconductor structure taken along the X-X axis of FIG. 1A at a seventh-intermediate fabrication stage, according to an illustrative embodiment.

FIG. 7 illustrates semiconductor structure 100 at a seventh-intermediate fabrication stage. During this stage, a first backside via layer $V_1$ and a second backside metallization layer $M_2$ are formed on first backside metallization layer $M_1$. First backside via layer $V_1$ can be formed by depositing an additional backside ILD layer 114 on the top surface of first backside metallization layer $M_1$, patterning the additional backside ILD layer 114 and utilizing conventional lithographic and etching processes to form vias. The etch process may be an anisotropic etch, such as RIE. The etch process may also be a selective etch process. Next, a suitable conductive metal is deposited in the vias to form metal vias 120 in first backside via layer $V_1$.

Second backside metallization layer 122 (also referred to as second backside metallization layer $M_2$) can be formed by depositing any suitable conductive metal on first backside via layer $V_1$ using any conventional deposition technique such as PVD, ALD, CVD and/or plating, followed by a planarization process such as CMP or any other suitable planarization process. A suitable conductive metal for second backside metallization layer $M_2$ can be any of those discussed above. Next, second backside metallization layer $M_2$ patterning is carried out by conventional lithography and etching processes.

Figure 8:
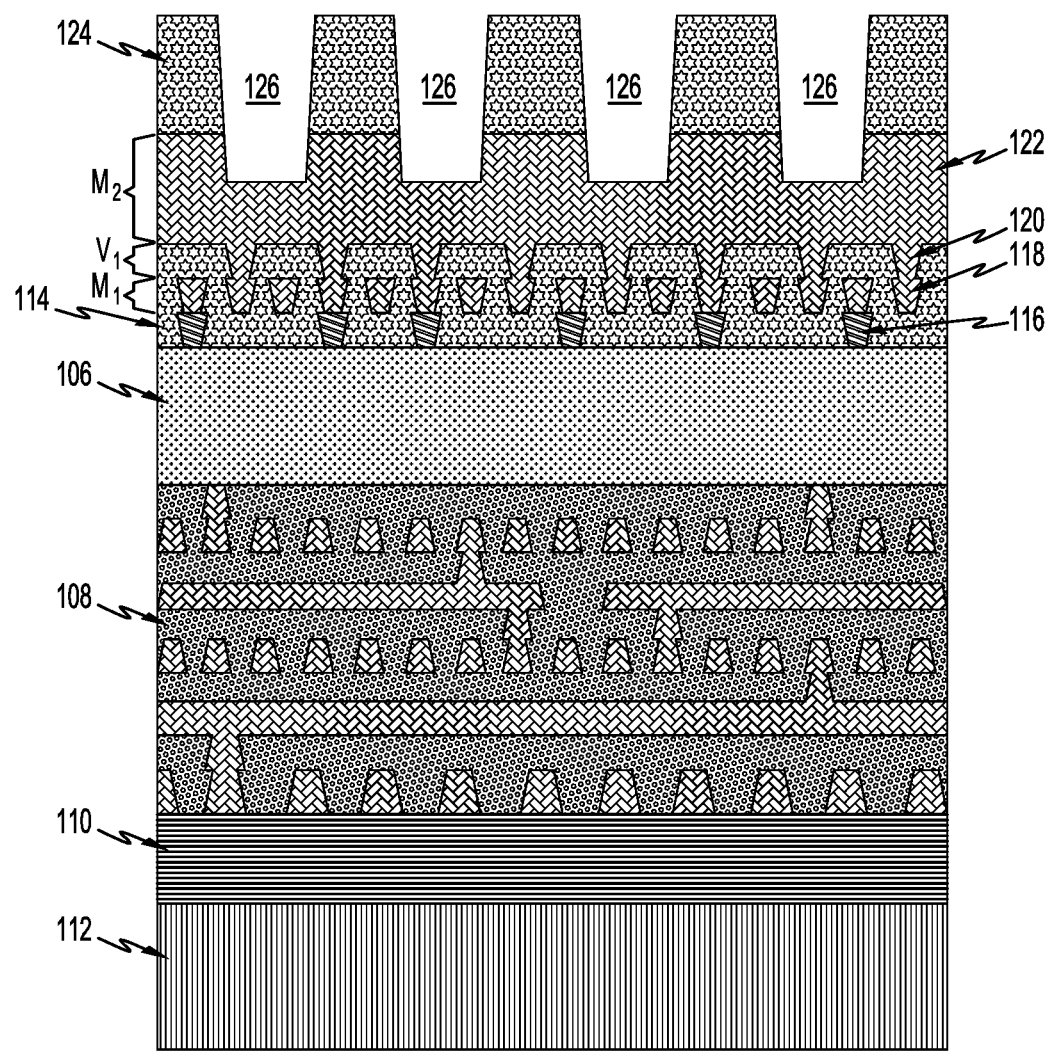
FIG. 8 depicts a cross-sectional view of a semiconductor structure taken along the X-X axis of FIG. 1A at an eighth-intermediate fabrication stage, according to an illustrative embodiment.

FIG. 8 illustrates semiconductor structure 100 at an eighth-intermediate fabrication stage. During this stage, openings 126 are formed in backside ILD layer 124. For example, backside ILD layer 124 is deposited on second backside metallization layer $M_2$ using any conventional deposition technique such as PVD, ALD, CVD and/or plating, followed by a planarization process such as CMP or any other suitable planarization process. Backside ILD layer 124 can be of a same or similar material as backside ILD layer 114 discussed above. Next, backside ILD layer 124 is patterned and a selective etch process such as RIE can be carried out to form openings 126.

Figure 9:
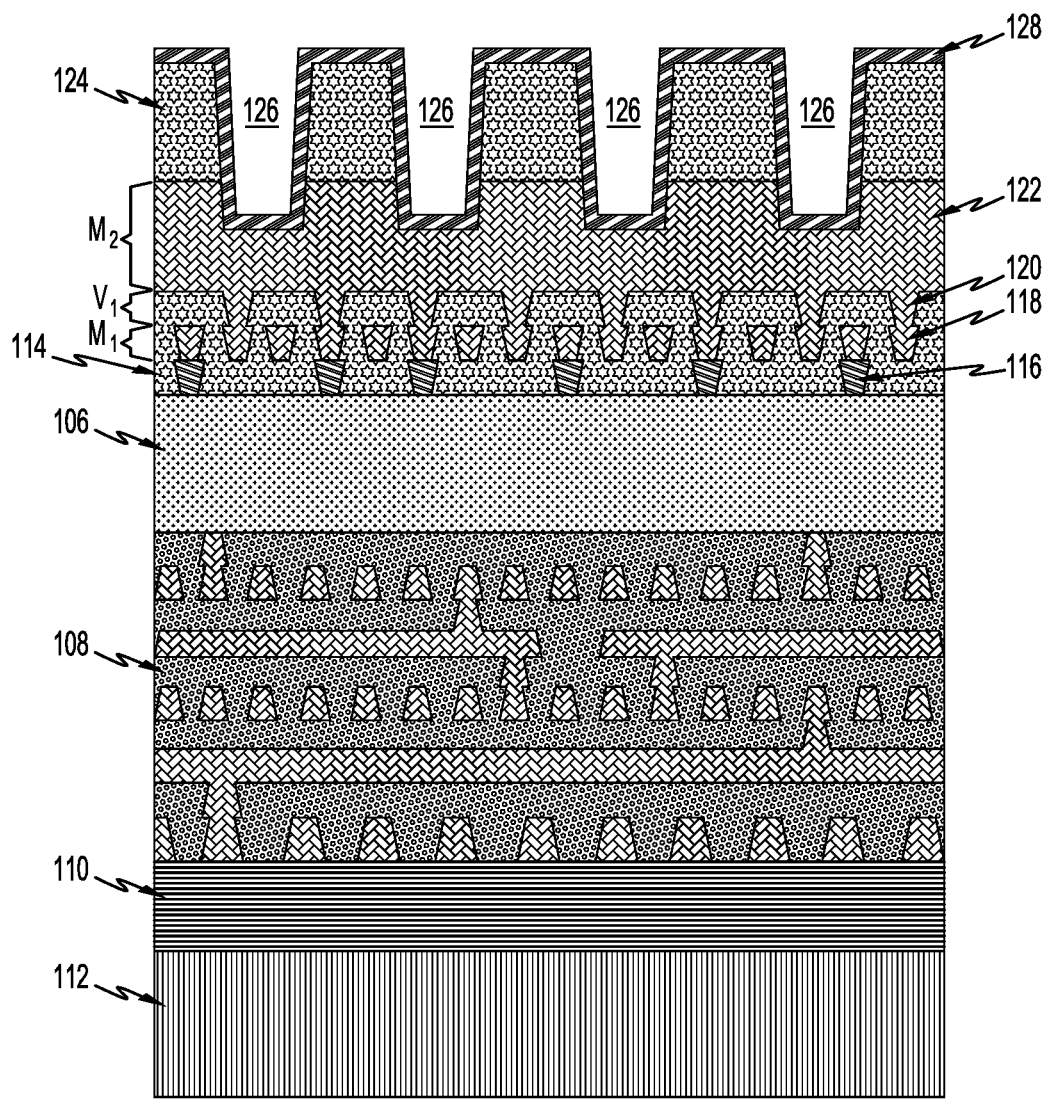
FIG. 9 depicts a cross-sectional view of a semiconductor structure taken along the X-X axis of FIG. 1A at a ninth-intermediate fabrication stage, according to an illustrative embodiment.

FIG. 9 illustrates semiconductor structure 100 at a ninth-intermediate fabrication stage. During this stage, a dielectric barrier layer 128 is formed on the exterior surfaces of backside ILD layer 124 and openings 126. Dielectric barrier layer 128 can be formed using any conventional deposition technique such as PVD, ALD, CVD and/or plating. A suitable material for dielectric barrier layer 128 includes, for example, any suitable high-k dielectric material. A suitable high-k dielectric material includes any dielectric material with a dielectric constant greater than 7.0. In one illustrative embodiment, suitable high-k dielectric materials include, for example, oxides, nitrides, oxynitrides, silicates (e.g., metal silicates), aluminates, titanates, nitrides, or any combination thereof. In one illustrative embodiment, suitable high-k dielectric materials include, for example, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 10:
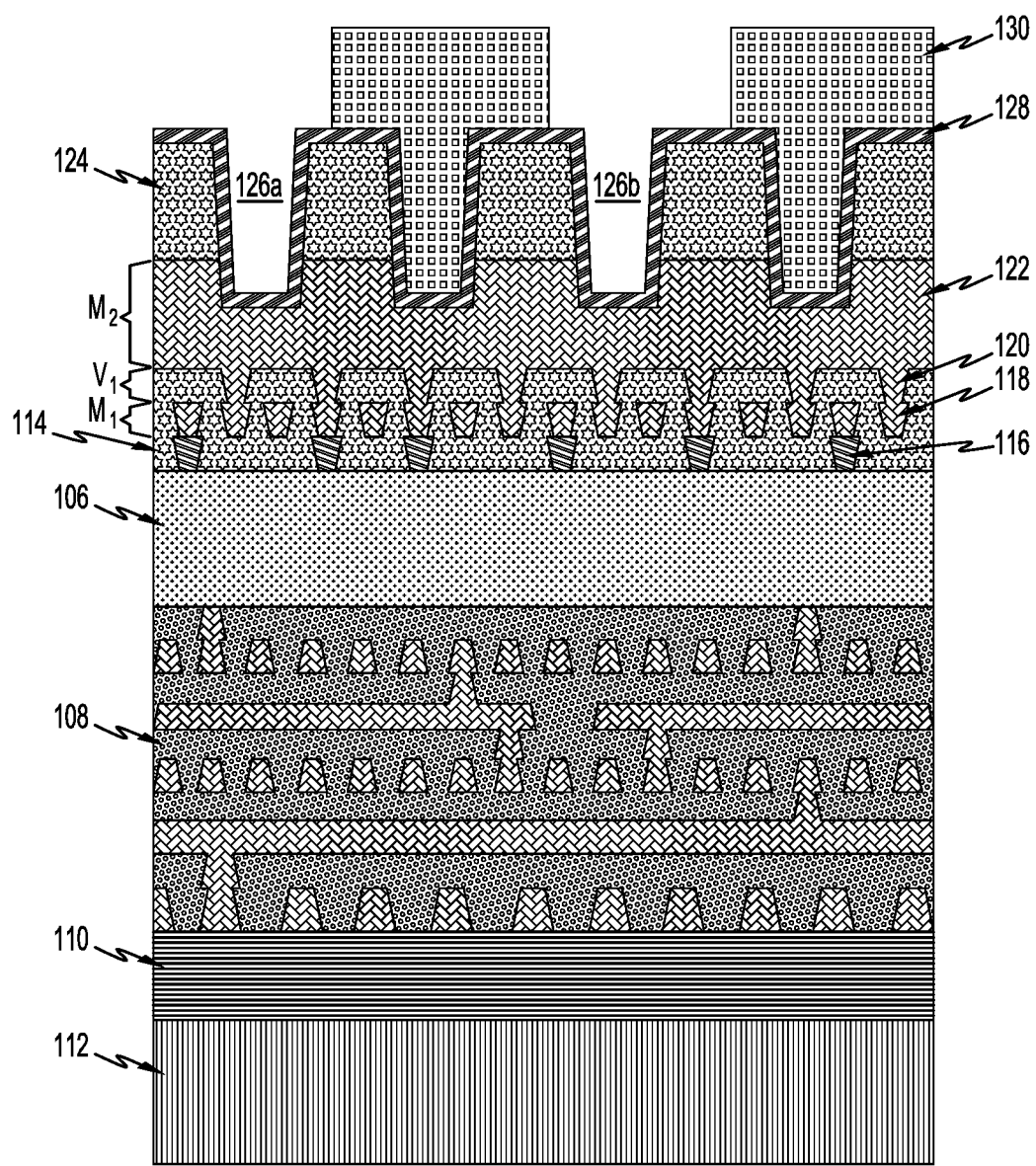
FIG. 10 depicts a cross-sectional view of a semiconductor structure taken along the X-X axis of FIG. 1A at a tenth-intermediate fabrication stage, according to an illustrative embodiment.

FIG. 10 illustrates semiconductor structure 100 at a tenth-intermediate fabrication stage. During this stage, a mask layer 130 (such as an organic planarization layer (OPL) or a spin-on-carbon (SOC)) is formed in selected openings 126. For example, in an illustrative embodiment, mask layer 130 is deposited in selected openings 126 using spin-on coating or any other suitable deposition process. Next, the mask layer 130 is patterned and a selective etch process such as RIE can be carried out to selectively remove mask layer 130 leaving openings 126a and 126b. This is to define the regions where second backside metallization layer $M_2$ and third backside metallization layer $M_3$ should be connected.

Figure 11:
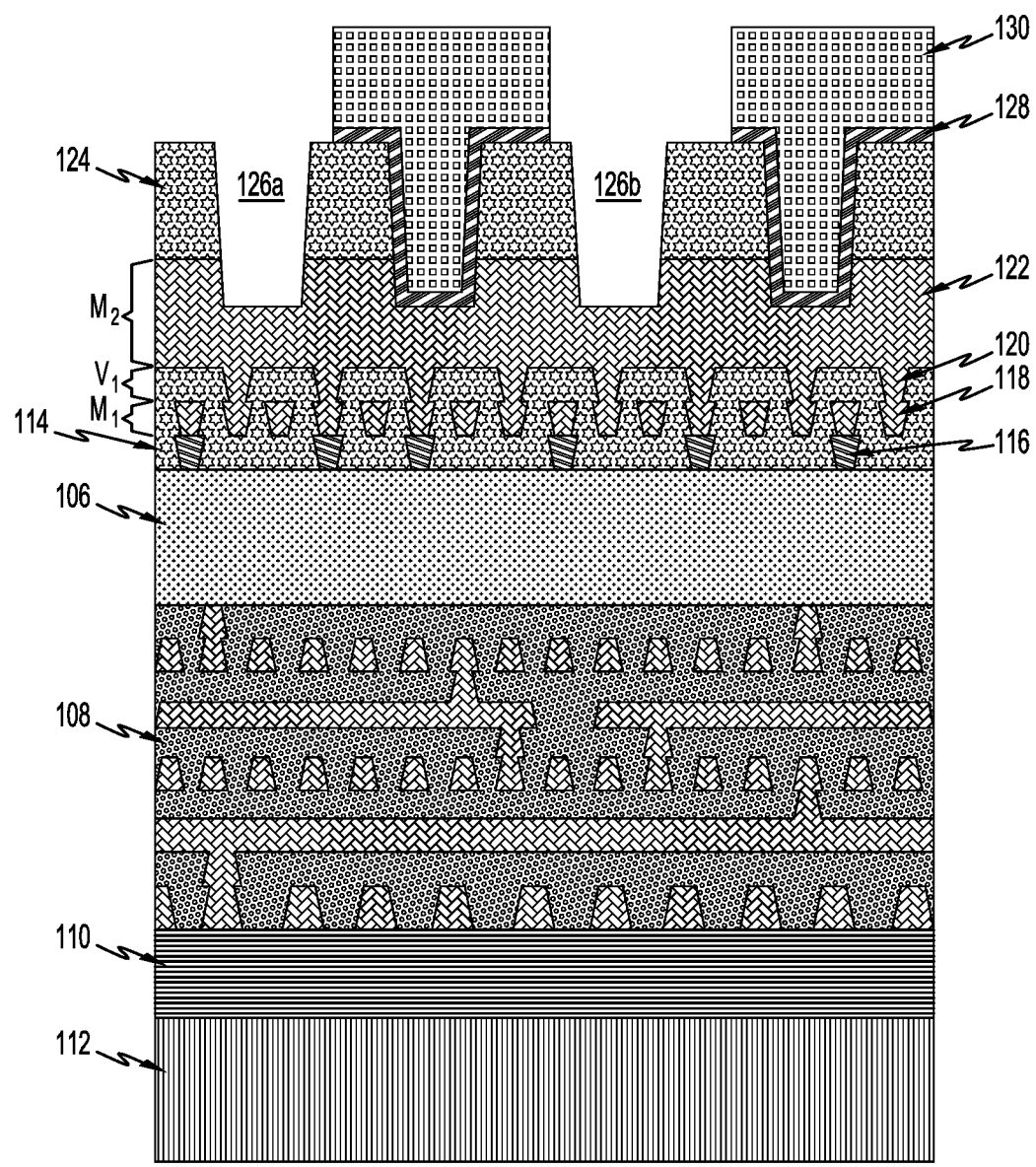
FIG. 11 depicts a cross-sectional view of a semiconductor structure taken along the X-X axis of FIG. 1A at an eleventh-intermediate fabrication stage, according to an illustrative embodiment.

FIG. 11 illustrates semiconductor structure 100 at an eleventh-intermediate fabrication stage. During this stage, the exposed portions of dielectric barrier layer 128 are removed using any selective etch process such as RIE.

FIG. 12 illustrates semiconductor structure 100 at a twelfth-intermediate fabrication stage. During this stage, third backside metallization layer $M_3$ is formed containing power (Vdd) rails 132 to provide supply voltage to the structure and ground (GND or Vss) rails 134 to form a series of power supplies. For example, in illustrative embodiments, mask layer 130 is first removed by, for example, an ash etching process, followed by deposition of a suitable conductive metal in each of the openings. The conductive metal can be deposited in a similar manner and of a similar material as discussed above. Any overfill of the conductive metal can be removed by a planarization process such as CMP.

FIG. 13 illustrates semiconductor structure 100 at a thirteenth-intermediate fabrication stage. During this stage, the power signals can be routed through a backside power delivery network 136 to provide power to a number of semiconductor devices. In illustrative embodiments, backside power delivery network 136 has fewer metal levels (about 5 or so) than the BEOL (more than 10). Backside power delivery network 136 is formed over the structure including power (Vdd) rails 132 and ground (GND or Vss) rails 134 and is based on creation of a wiring scheme that is disposed on both sides of the device layer (front end of line structure).

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETS, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a first metallization layer comprising a first plurality of metal containing lines; and
   a second metallization layer located above the first metallization layer, wherein the second metallization layer comprises a second plurality of metal containing lines;
   wherein the first metallization layer is a first backside metallization layer;
   wherein a first group of the second plurality of metal containing lines is disposed within the first metallization layer; and wherein the first group of the second plurality of metal containing lines is isolated from the first metallization layer by a dielectric barrier layer.

2. The semiconductor structure according to claim 1, wherein the second metallization layer is a second backside metallization layer.

3. The semiconductor structure according to claim 1, wherein the second plurality of metal containing lines are oriented perpendicular to the first plurality of metal containing lines.

4. The semiconductor structure according to claim 1, wherein the second plurality of metal containing lines further comprises a second group of the second plurality of metal containing lines, wherein at least one of the metal containing lines of the second group is disposed on at least one of the first plurality of metal containing lines.

5. The semiconductor structure according to claim 1, wherein the first group of the second plurality of metal containing lines comprises ground Vss rails.

6. The semiconductor structure according to claim 5, wherein the second plurality of metal containing lines further comprises a second group comprising power Vdd rails.

7. The semiconductor structure according to claim 1, wherein the dielectric barrier layer comprises a high-k dielectric material.

8. The semiconductor structure according to claim 1, wherein the first metallization layer and the second metallization layer are part of a backside power delivery network.

9. The semiconductor structure according to claim 1, wherein the second plurality of metal containing lines further comprises a second group of the plurality of metal containing lines in direct contact with a first group of the first plurality of metal containing lines.

10. A semiconductor structure, comprising:
a first metallization layer comprising a first plurality of metal containing lines in a first orientation; and
a second metallization layer located above the first metallization layer, wherein the second metallization layer comprises a second plurality of metal containing lines in a second orientation;
wherein the second plurality of metal containing lines comprises a first group of the second plurality of metal containing lines and a second group of the second plurality of metal containing lines;
wherein the first group of the second plurality of metal containing lines is disposed within the first metallization layer and isolated from the first metallization layer by a dielectric barrier layer; and
wherein at least one of the metal containing lines of the second group of the second plurality of metal containing lines is directly connected to at least one of the first plurality of metal containing lines.

11. The semiconductor structure according to claim 10, wherein the first metallization layer is a first backside metallization layer and the second metallization layer is a second backside metallization layer.

12. The semiconductor structure according to claim 10, wherein the second plurality of metal containing lines are oriented perpendicular to the first plurality of metal containing lines.

13. The semiconductor structure according to claim 10, wherein the first group of the second plurality of metal containing lines comprises ground Vss rails.

14. The semiconductor structure according to claim 13, wherein the second group of the second plurality of metal containing lines comprises power Vdd rails.

15. The semiconductor structure according to claim 10, wherein the dielectric barrier layer comprises a high-k dielectric material.

16. The semiconductor structure according to claim 10, wherein the first metallization layer and the second metallization layer are part of a backside power delivery network.

17. The semiconductor structure according to claim 10, wherein the first plurality of metal containing lines comprises a first group comprising ground Vss rails and a second group comprising power Vdd rails.

18. An integrated circuit, comprising:
one or more semiconductor structures, wherein at least one of the one or more semiconductor structures comprises:
a first metallization layer comprising a first plurality of metal containing lines; and
a second metallization layer located above the first metallization layer, wherein the second metallization layer comprises a second plurality of metal containing lines;
wherein the first metallization layer is a first backside metallization layer;
wherein a first group of the second plurality of metal containing lines is disposed within the first metallization layer; and
wherein the first group of the second plurality of metal containing lines is isolated from the first metallization layer by a dielectric barrier layer.

19. The integrated circuit according to claim 18, wherein the second metallization layer is a second backside metallization layer; and wherein the second plurality of metal containing lines are oriented perpendicular to the first plurality of metal containing lines.

20. The integrated circuit according to claim 18, wherein the first metallization layer and the second metallization layer are part of a backside power delivery network.

* * * * *